United States Patent

Nielsen et al.

[11] Patent Number: 5,969,958
[45] Date of Patent: Oct. 19, 1999

[54] METHOD FOR MEASURING PHASE CURRENTS IN AN INVERTER

[75] Inventors: Søren Ejnar Nielsen, Sønderborg; Jens Ulrik Jæger, Gråsten; Johnny Wahl Jensen; Paul Bach Thøgersen, both of Sønderborg, all of Denmark

[73] Assignee: Danfoss, Nordborg, Denmark

[21] Appl. No.: 08/894,007

[22] PCT Filed: Jan. 19, 1996

[86] PCT No.: PCT/DK96/00030

§ 371 Date: Oct. 14, 1997

§ 102(e) Date: Oct. 14, 1997

[87] PCT Pub. No.: WO96/23347

PCT Pub. Date: Aug. 1, 1996

[30] Foreign Application Priority Data

Jan. 23, 1995 [DK] Denmark .................................. 0076/95

[51] Int. Cl.⁶ .......................... H02M 1/12; H02M 3/24; G01R 19/00
[52] U.S. Cl. ................... 363/41; 363/98; 363/37; 318/811
[58] Field of Search ................... 363/98, 37, 41, 363/132, 40; 318/811, 781

[56] References Cited

U.S. PATENT DOCUMENTS

| | | | |
|---|---|---|---|
| 4,520,298 | 5/1985 | Abbondanti | 318/490 |
| 5,309,349 | 5/1994 | Kwan | 363/98 |
| 5,623,192 | 4/1997 | Yamamoto | 363/41 |

*Primary Examiner*—Peter S. Wong
*Assistant Examiner*—Rajnikant B. Patel
*Attorney, Agent, or Firm*—Lee, Mann, Smith, McWilliams, Sweeney & Ohlson

[57] ABSTRACT

The present invention relates to the measuring of phase currents in an inverter, where by pulse width modulation controlled semiconductor switches invert a direct voltage from an intermediate circuit into a three-phase alternating voltage. The phase currents are measured by measuring the intermediate circuit current when an active switch state creates an unambiguous relation between the intermediate circuit current and a phase current. Time shifts in the phase current measuring can be avoided by measuring the value $i_d$ of the intermediate circuit current in two separate settings ($\underline{u}_1$, $\underline{u}_1$, $\underline{u}_6$, $\underline{u}_6$) of the same active switch state ($\underline{u}_1$, $\underline{u}_6$) in a modulation period ($T_{sw}$) and by creating a resulting means value of the measured values. The mean values can be related in time to the center of the modulation period, and the third phase current at the same time can be calculated, because the sum of the phase currents is equal to zero.

3 Claims, 2 Drawing Sheets

Fig. 1
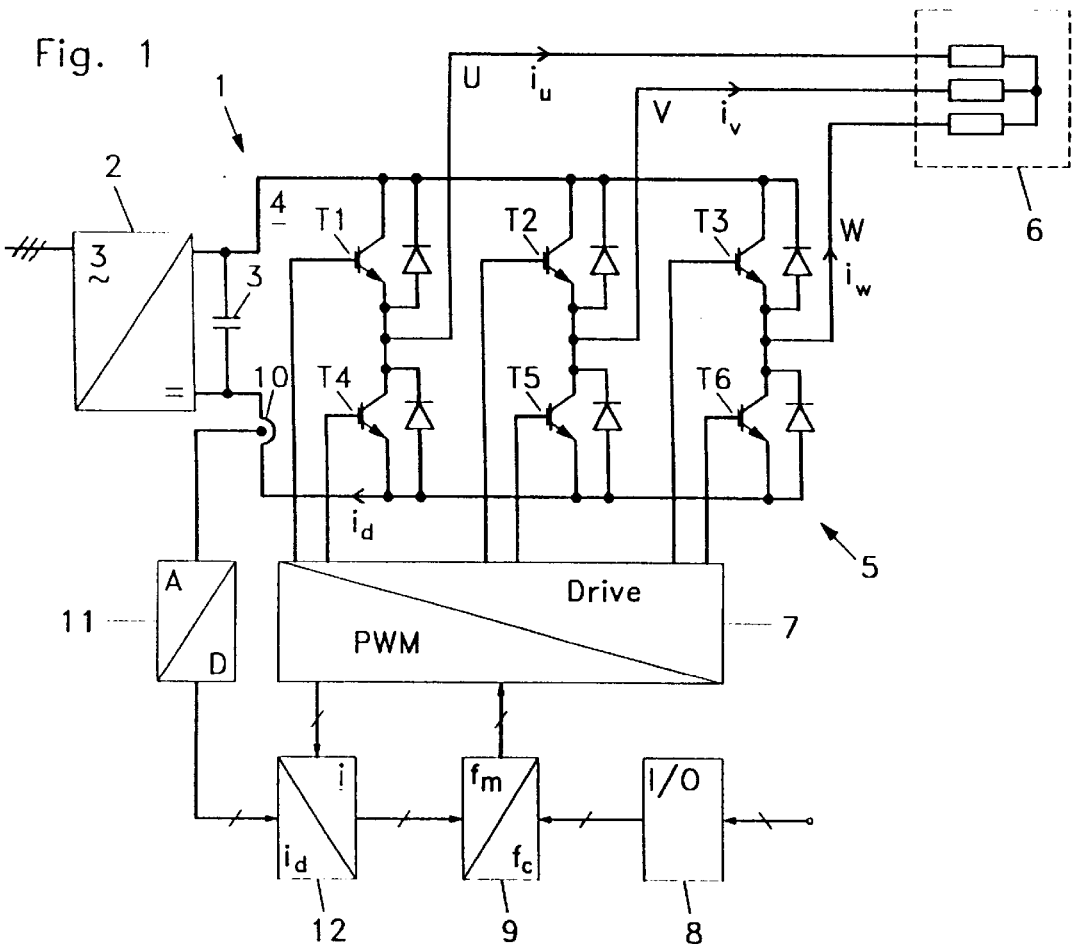
Fig. 2
| T1 | T2 | T3 | $\underline{U}$ | $i_d$ | PWM |
|---|---|---|---|---|---|
| 0 | 0 | 0 | $\underline{U}_0$ | o | — |
| 0 | 0 | 1 | $\underline{U}_5$ | $i_w$ | W |
| 0 | 1 | 0 | $\underline{U}_3$ | $i_v$ | V |
| 0 | 1 | 1 | $\underline{U}_4$ | $-i_u$ | VW |
| 1 | 0 | 0 | $\underline{U}_1$ | $i_u$ | U |
| 1 | 0 | 1 | $\underline{U}_6$ | $-i_v$ | UW |
| 1 | 1 | 0 | $\underline{U}_2$ | $-i_w$ | UV |
| 1 | 1 | 1 | $\underline{U}_7$ | o | UVW |
Fig. 3
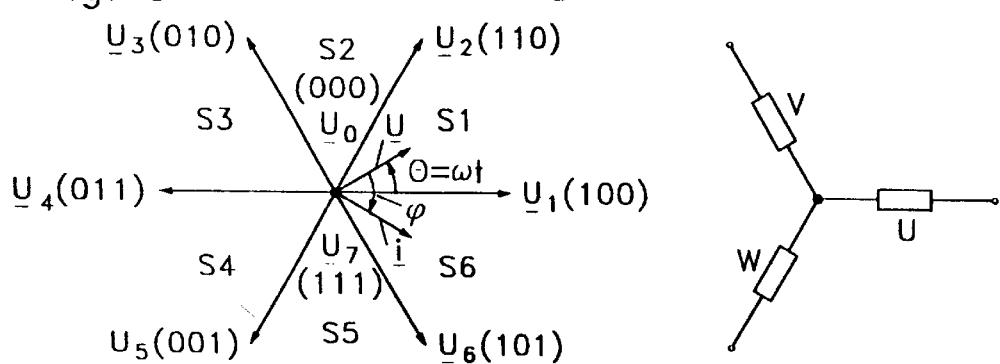

Fig. 4

| Sector | Switchsequence | | | | | | | Intermediate circuit current | | | | | | |
|---|---|---|---|---|---|---|---|---|---|---|---|---|---|---|
| S1 | $U_0$ | $U_1$ | $U_2$ | $U_7$ | $U_2$ | $U_1$ | $U_0$ | 0 | $i_u$ | $-i_w$ | 0 | $-i_w$ | $i_u$ | 0 |
| S2 | $U_0$ | $U_3$ | $U_2$ | $U_7$ | $U_2$ | $U_3$ | $U_0$ | 0 | $i_v$ | $-i_w$ | 0 | $-i_w$ | $i_v$ | 0 |
| S3 | $U_0$ | $U_3$ | $U_4$ | $U_7$ | $U_4$ | $U_3$ | $U_0$ | 0 | $i_v$ | $-i_u$ | 0 | $-i_u$ | $i_v$ | 0 |
| S4 | $U_0$ | $U_5$ | $U_4$ | $U_7$ | $U_4$ | $U_5$ | $U_0$ | 0 | $i_w$ | $-i_u$ | 0 | $-i_u$ | $i_w$ | 0 |
| S5 | $U_0$ | $U_5$ | $U_6$ | $U_7$ | $U_6$ | $U_5$ | $U_0$ | 0 | $i_w$ | $-i_v$ | 0 | $-i_v$ | $i_w$ | 0 |
| S6 | $U_0$ | $U_1$ | $U_6$ | $U_7$ | $U_6$ | $U_1$ | $U_0$ | 0 | $i_u$ | $-i_v$ | 0 | $-i_v$ | $i_u$ | 0 |

Fig. 5

| Sector | Switchsequence | | | | | | Intermediate circuit current | | | | | |
|---|---|---|---|---|---|---|---|---|---|---|---|---|
| S1 | $U_0$ | $U_1$ | $U_2$ | $U_2$ | $U_1$ | $U_0$ | 0 | $i_u$ | $-i_w$ | $-i_w$ | $i_u$ | 0 |
| S2 | $U_0$ | $U_3$ | $U_2$ | $U_2$ | $U_3$ | $U_0$ | 0 | $i_v$ | $-i_w$ | $-i_w$ | $i_v$ | 0 |
| S3 | $U_0$ | $U_3$ | $U_4$ | $U_4$ | $U_3$ | $U_0$ | 0 | $i_v$ | $-i_u$ | $-i_u$ | $i_v$ | 0 |
| S4 | $U_0$ | $U_5$ | $U_4$ | $U_4$ | $U_5$ | $U_0$ | 0 | $i_w$ | $-i_u$ | $-i_u$ | $i_w$ | 0 |
| S5 | $U_0$ | $U_5$ | $U_6$ | $U_6$ | $U_5$ | $U_0$ | 0 | $i_w$ | $-i_v$ | $-i_v$ | $i_w$ | 0 |
| S6 | $U_0$ | $U_1$ | $U_6$ | $U_6$ | $U_1$ | $U_0$ | 0 | $i_u$ | $-i_v$ | $-i_v$ | $i_u$ | 0 |

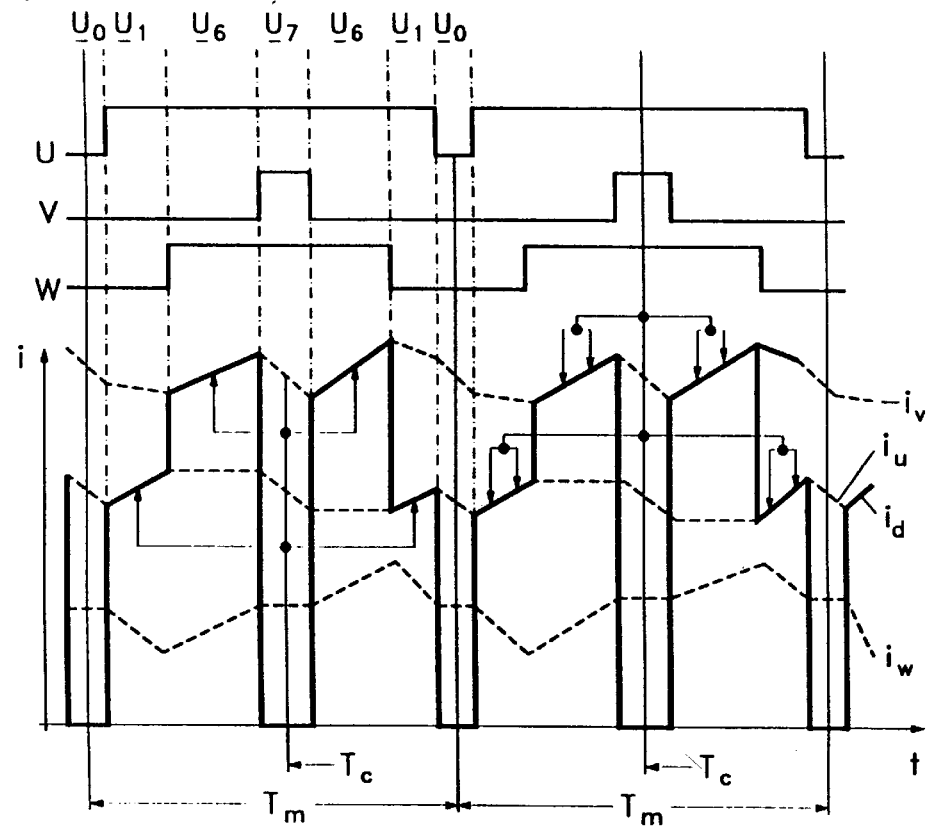

Fig. 6

METHOD FOR MEASURING PHASE CURRENTS IN AN INVERTER

BACKGROUND OF THE INVENTION

The present invention relates to a method for measuring phase currents in an inverter, where controlled semiconductor switches invert direct current by pulse width modulation from an intermediate circuit to a three-phase alternating voltage, and where the phase currents are measured by measuring the intermediate circuit current when an active switch state creates an unambiguous relation between the intermediate circuit current and a phase current.

The measuring principle is known from EP 0 502 226 A1, among others. That document describes a detection circuit, which by detecting the phase voltages selects the periods of time when said unambiguous relation between the intermediate circuit current and a phase current exists. The detection circuit controls an integration circuit of the track-and-hold type with three channels, which are connected alternately to a sensor for the intermediate circuit current. One of the channels is controlled to integrate the contributions of the individual phase currents to the intermediate circuit current when there is a potential applied on the inverter output, that is that a voltage is applied that is different from zero. The resulting signal represents the effective current in a connected three-phase a.c. machine. The two other channels are controlled so that the integrated signals periodically follow each its own phase current, and these signals are combined with data on the switch state into an individual reconstruction of the three phase currents.

The known circuit and the measuring method realised in it involve quite extensive analog signal processing. Due to the principle of integration applied, the circuit has a low upper cut-off frequency, and therefore it will be less suitable for inverters with high dynamics, as for example for servo control applications.

Seen in relation to this, it is the object of the present invention to provide a method for measuring phase currents in an inverter which allows a higher upper cut-off frequency, and which can be realised with less circuitry complications than known before.

SUMMARY OF THE INVENTION

According to the present invention this object is realised by measuring the value of the intermediate circuit current in two separate settings of the same active switch state in a modulation period, and by creating a resulting mean value of the measured values.

This measuring method is optimally adapted to the time symmetry, which is normally realised by the control of the semiconductor switches, and which will now be explained quite briefly. At the usual vectorial observation of the of the eight possible switch states in a standard three-phase inverter bridge, these are divided into two zero vectors where no voltage is applied on the phase conductors, and six active vectors where a voltage is applied on the phase conductors. An arbitrary application of voltage on the phase conductors may then be realised by a pulse width modulated addition of two of these active vectors.

The modulation is normally accomplished as two-sided modulation, where in a modulation period one jumps for example from one zero vector to a first active vector, then to a second active vector and then to the second zero vector, and then back via the second active vector and the first active vector to the first zero vector. This sequence can always be carried out in such a manner that the transition between the various vectors or switch states requires only activation or deactivation of a single switch, whereby the sequence minimises the switch losses.

From this it is seen that the first active vector or switch state occurs twice in each modulation period. The second active switch state also occurs twice in each modulation period. Furthermore, the active switch states lie timewise mirror-symmetrically distributed in relation to the centre of the modulation period.

The first active switch state enables measuring of a first phase current by measuring of the intermediate circuit current, and the second active switch state enables measuring of a second phase current by measuring of the intermediate circuit current.

Now if we consider the first phase current, according to the present invention this is measured twice in each modulation period, and a (first) resulting mean value of the two measured values is created. Due to the time symmetry this resulting mean value can be related to the centre of the modulation period. In the same modulation period the second phase current can likewise be measured twice in the manner explained in the present invention, whereby a (second) resulting mean value is created, which can likewise be related to the centre of the modulation period. Since both current measurings can be related to the same time, and the sum of the phase currents is equal to zero at any time, the third phase current can be calculated immediately.

The method according to the present invention therefore enables timewise correct and complete measuring of the phase currents of the inverter in each modulation period, which provides a basis for designing very simple and fast control and regulation systems. No phase errors (time shift) occur between the three measured components of the current vector (output or phase currents), nor do phase errors (time shift) occur in the measuring of the position of the current vector in relation to the applied voltage vector. Such time shifts or phase errors have otherwise been common in measuring methods where the intermediate circuit current is measured, because the individual currents are measured consecutively.

In an advantageous embodiment the value of the intermediate circuit current and thereby the phase current is measured several times in each separate setting of the same active switch state, and these measurements are averaged separately for each setting in order to create a separate mean value, after which the resulting mean value is created as the mean value of the separate mean values. This increases the immunity of the method against noise shares in the phase currents.

BRIEF DESCRIPTION OF THE DRAWINGS

However, the applicability of the invention is not limited to the switch sequence just described, which will also appear from the following description of the various embodiments, where references are made to the accompanying drawings.

FIG. 1 is a block diagram of an inverter, where the method according to the invention is realised.

FIG. 2 is a table of the possible switch states in the inverter and the resulting voltage vectors, currents in the intermediate circuit and voltages applied on the phase conductors.

FIG. 3 illustrates the spatial position of the voltage vectors in a three-phase a.c. machine.

FIG. 4 is a table of switch sequences and the resulting voltage vectors that are passed in a pulse width modulation in order to apply a voltage vector with variable direction and amplitude on the a.c. machine.

FIG. 5 is a table of another possible modulation strategy, where a phase in each modulation period is kept free of shifts/switchings.

FIG. 6 shows the sequence of the phase couplings and the resulting phase currents, two of which can be measured in the intermediate circuit, for two modulation periods in voltage sector S6, cf. FIG. 3.

DESCRIPTION OF THE PREFERRED EMBODIMENTS

The inverter 1 shown in FIG. 1 consists of an uncontrolled rectifier 2 with intermediate circuit capacitor 3, which feeds a d.c. intermediate circuit 4 with an inverter bridge 5. The inverter bridge consists of controlled semiconductor switches T1, T2, T3, T4, T5 and T6, which by pulse width modulation transform the direct voltage of the intermediate circuit into a three-phase alternating voltage on the output or phase conductors U, V, and W. In the embodiment shown, the semiconductor switches are transistors of the IGBT type (Insulated Gate Byte Polar Transistor). As usual, freewheeling diodes are coupled in antiparallel with the transistors. The three-phase output voltage U, V, W of the inverter is supplied with a load 6 in the form of a three-phase asynchronous motor, a three-phase voltage supply network, or similar.

The inverter bridge is controlled by a control circuit 7, which includes a pulse width modulator PVM and a driver circuit for control of the transistors. For operation of the inverter, this is provided with a user interface 8, which emits signals to a regulation and control unit 9.

The unit 9 functions as a regulator, which by the frequency $f_c$ monitors the operational functions of the inverter, emitting any corrective signals which are transformed into the modulation frequency $f_m$ of the pulse width modulator and transmitted to the pulse width modulator in the control circuit 7.

The applied phase voltages U, V, and W cause phase currents $i_u$, $i_v$ and $i_w$, which are transformed via the inverter bridge to a resulting current $i_d$ in the intermediate circuit. The intermediate circuit is provided with a current sensor 10 for detection of the intermediate circuit current $i_d$, and the detected signal is passed on to an analog digital converter 11, which is controlled by the pulse width modulator 7. The digitalised intermediate circuit current signal is passed on to a processor unit 12, which on the basis of the measured intermediate circuit currents $i_d$ and data on the positions of the switches from the pulse width modulator 7 calculates the three phase currents $i_u$, $i_v$ and $i_w$ in the form of a current vector $\underline{i}$, which is made available to the regulating unit 9.

As it is known, it is possible with an inverter bridge of the type shown to realise 8 different switch states or applications of voltage on the phase conductors U, V and W. These switch states are shown in tabular form in FIG. 2, which must be observed together with FIG. 3. The latter shows on the right side a principle diagram of the spatial position of the windings in a star-connected asynchronous motor. On the left side, the voltages applied on the motor, which the switch states can create, are shown as a vector diagram with vectors $\underline{u}_1$–$\underline{u}_6$. For example, the switch state 100, where transistor T1 is conducting, while the transistors T2 and T3 are blocked, gives an application of voltage on phase conductor U, whereby the resulting voltage vector $\underline{u}_1$ points in the direction which is determined by the position of the phase winding U. In this connection it must be noted that it is sufficient to observe the three transistors T1, T2 and T3, because the other three transistors T4, T5 and T6 are controlled complementarily in relation to T1,T2 and T3.

If, for example, we observe the voltage vector $\underline{u}$ in FIG. 3, it results from applying voltage on the phase conductors U and W. The resulting voltage vector $\underline{u}$ points opposite to the position of the U winding.

An arbitrary application of voltage on the asynchronous motor, respectively the three phase conductors U, V and W, can now be realised as a voltage vector $\underline{u}$ as shown in FIG. 3. In order to realise this application of voltage, a pulse width modulation is carried out, that is, in a given period of time the vector $\underline{u}_1$ is applied, and in another given period of time the vector $\underline{u}_2$, where the relative duration of the periods indicates the angle of the resulting voltage vector, and the absolute duration of the periods determines the absolute value of the voltage vector, the resulting amplitude. The pulse width modulation is effected in such a manner that the resulting voltage vector $\underline{u}$ rotates with a time dependent angle $\theta = wt$, which will determine the frequency of the three-phase alternating voltage generated on the phase conductors U, V and W. The application of a three-phase voltage results in a current vector $\underline{i}$, which is normally phase shifted in relation to the voltage vector with the angle $\phi$, and which rotates at the same frequency.

Therefore the inverter can feed a three-phase a.c. machine with three-phase alternating current with adjustable amplitude and frequency, thereby controlling its rotational speed and torque.

As mentioned, the pulse width modulation is effected by periodical application of the voltage phase vectors $\underline{u}_1$–$\underline{u}_6$, respectively the corresponding switch states in the inverter bridge. A commonly used modulation strategy appears in FIG. 4. As it appears from this table, a vector is realised in sector S1, cf. FIG. 3, at a switch sequence $\underline{u}_0$, $\underline{u}_1$, $\underline{u}_2$, $\underline{u}_7$, $\underline{u}_2$, $\underline{u}_1$, $\underline{u}_0$. The vector $\underline{u}_0$ corresponds to the three observed transistors being blocked. In this situation the a.c. machine is switched off from the intermediate circuit. The next switch state is $\underline{u}_1$, where transistor T1 is conducting together with T5 and T6, T2 and T3 being blocked. In this switch state the voltage on phase conductor U is different from zero, and the current $i_d$ in the intermediate circuit is equal to $i_u$, cf. the diagram in FIG. 1 and the table in FIG. 2. In switch position $\underline{u}_2$, T1 and T2 are conducting, whereby the voltage on the phases U and V becomes different from zero, and the current $i_d$ in the intermediate circuit is equal to the phase current $-i_w$. This appears also from the diagram in FIG. 1 and the table in FIG. 2. The next step in the switch sequence is activation of all three transistors $U_7$, which again switches the a.c. machine off from the intermediate circuit. Hereafter the same active switch states are passed, where voltage is applied on the phase conductors, in reverse sequence, and the switch sequence is concluded with the vector $\underline{u}_0$, where the a.c. machine is again switched off from the intermediate circuit.

In the same manner an arbitrary voltage vector in one of the other voltage sectors S2–S6 can be realised with the switch sequences shown in FIG. 4 and resulting in the currents in the intermediate circuit shown in the same table.

The switch sequences according to FIG. 4 have the effect that each transistor T1–T3 switches on and off once in each switch sequence, and that a transition from one state to the next state requires only one change of state in a transistor. Another modulation strategy, which is also commonly used, appears from FIG. 5. No zero vectors $\underline{u}_7$ are here inserted between the active vectors $\underline{u}_2$, $\underline{u}_4$ or $\underline{u}_6$, and by comparing the switch sequences shown with the table in FIG. 2 it is seen that each switch sequence is passed with a voltage-free phase during the whole series of sequences. The sequence results in lower losses in the switches, because the number of switching transistors is less, but it results in a lower effective modulation frequency and thereby greater motor losses. The choice between the two modulation strategies is therefore a question of dimensioning.

As it appears from the explanation up to this point, the intermediate circuit current in all the switch sequences shown is unambiguously connected to the voltage vector just applied. Each switch sequence makes it possible to measure two phase currents in the intermediate circuit, and each phase current can be measured twice in each switch sequence. This circumstance is exploited by the measuring method according to the present invention, as it will now be explained in connection with an exposition of FIG. 6.

FIG. 6 consists of two families of diagrams. At the top is show the application of voltage of the phase conductors and at the bottom are shown the resulting phase currents as a function of time. Both families of diagrams are shown for two modulation periods, that is for two periods of time, which are essentially shorter than the base period in the resulting three-phase alternating current on the phase conductors U, V and W. The diagram illustrates the generation of a resulting voltage vector which lies in sector S6 in FIG. 3. The realised switch sequence stands in the last line in the table in FIG. 4. The dotted lines in the current diagram in FIG. 6 show the course of the individual phase currents, while the solid line indicates the current occurring in the intermediate circuit.

As shown in FIG. 6, the modulation period starts with application of a zero vector or switch state $\underline{u}_0$. Then $\underline{u}_1$ is applied, whereby the current in the intermediate circuit becomes $i_d=i_u$, and at the subsequent application of switch state $\underline{u}_6$ the intermediate circuit current $i_d$=the phase current $-i_v$. In the middle of the modulation sequence a zero vector $u_7$ is applied, where the intermediate circuit current is equal to 0, whereafter $\underline{u}_6$ and $\underline{u}_1$, are applied in reverse order with resulting intermediate circuit currents $-i_v$ and $i_u$. The modulation period is concluded with application of the 0 vector $\underline{u}_0$.

In the course of the modulation sequence, two measurings are made of the phase current $i_u$ and two measurings of the phase current $-i_v$, each time in the middle of the time interval where the related switch state exists. As it appears from FIG. 6, the symmetry of the modulation pattern allows for the pairs of mean values generated by these measurings to be related to the centre of the modulation period. The generation of the mean values occurs in the processor 12 (FIG. 1), which is fed with time related information from the pulse width modulator 7. The third phase current $i_w$, which is not mirrored in the intermediate circuit current, can be calculated from the mean values generated, because the sum of the three phase currents is equal to 0.

An alternative method of carrying out the measurings is shown in the right half of FIG. 6. Here the currents $i_u$ and $-i_v$ are measured twice for each voltage vector at times lying symmetrically in relation to the centre of the switching-in of the individual voltage vector. A mean value is generated from the two measured values for each voltage vector, and finally a resulting mean value is generated from the individual mean values of the pairs of connected voltage vectors. Like at the procedure in the left half of FIG. 6 the result is a current measuring, which can be related to the centre of the modulation period. The last described procedure requires a more complicated circuit if it is designed in analog switching technology, or larger/faster calculating power if it is realised in digital switching technology, but then it has better noise suppression than the first described procedure.

According to the switching technology employed, the control circuits 7, 8, 9 and 12 can be realised as a microprocessor controlled circuit or an application specific, integrated circuit where the single function blocks are not physically separated. By choosing a mixed analog/digital circuit technique also the analog/digital converter 11 can be integrated in a single, integrated circuit.

We claim:

1. A method for measuring phase currents in an inverter whereby pulse width modulation controlled semiconductor switches invert direct voltage from an intermediate circuit into a three-phase alternating voltage, and where the phase currents are measured by measuring intermediate circuit current of the intermediate circuit when an active switch state creates an unambiguous relation between the intermediate circuit current and a phase current, the method comprising the further steps of measuring the value of the intermediate circuit current in two separate settings of the same active switch state in a modulation period $(T_m)$, and creating a resulting mean value of the measured values.

2. A method according to claim 1, in which the value of the intermediate circuit current is measured several times in each separate setting $\underline{u}_1$, $\underline{u}_1$; $\underline{u}_6$, $\underline{u}_6$ of the same active switch state, for each separate setting a separate mean value of the measured values is created, and the resulting mean value is created as the mean value of the separate mean values.

3. An inverter comprising controlled semiconductor switches using pulse width modulation to invert direct voltage from an intermediate circuit into a three-phase alternating voltage, a measuring device for measuring instantaneous values of the intermediate circuit current of the intermediate circuit, a control device to activate the measuring device when an active switch state creates an unambiguous relation between the intermediate circuit current and a phase current, the control device having means to activate the measuring device at two separate settings $\underline{u}_1$, $\underline{u}_1$; $\underline{u}_6$, $\underline{u}_6$ of the same, active switch state $(\underline{u}_1, \underline{u}_6)$ in a modulation period $(T_m)$, and the inverter having a converter for creating a resulting mean value from the measured values.

* * * * *